Feb. 16, 1971 T. M. YACKISH 3,564,419

PULSE COUNTING SQUELCH CIRCUIT

Filed March 10, 1969

INVENTOR
THOMAS M. YACKISH

BY
Mueller, Aichele & Rauner

ATTYS.

United States Patent Office 3,564,419

Patented Feb. 16, 1971

3,564,419

PULSE COUNTING SQUELCH CIRCUIT

Thomas M. Yackish, Hammond, Ind., assignor to Motorola, Inc., Franklin Park, Ill.

Filed Mar. 10, 1969, Ser. No. 805,723
Int. Cl. H03g 3/24
U.S. Cl. 325—348 6 Claims

ABSTRACT OF THE DISCLOSURE

The random distribution of zero axis crossings of noise as compared with the regular zero axis crossings of a desired signal is used to determine that the signal is being received. Zero axis crossings in a first direction are coupled through a gate to a counter to be counted thereby. Zero axis crossings in the other direction are used to close the gate to prevent the counting of the zero axis crossings in the first direction for a predetermined period of time after a zero axis crossing in the second direction. By properly choosing the predetermined time period the probability is very high that only noise pulses will be counted.

BACKGROUND OF THE INVENTION

Figure 1:
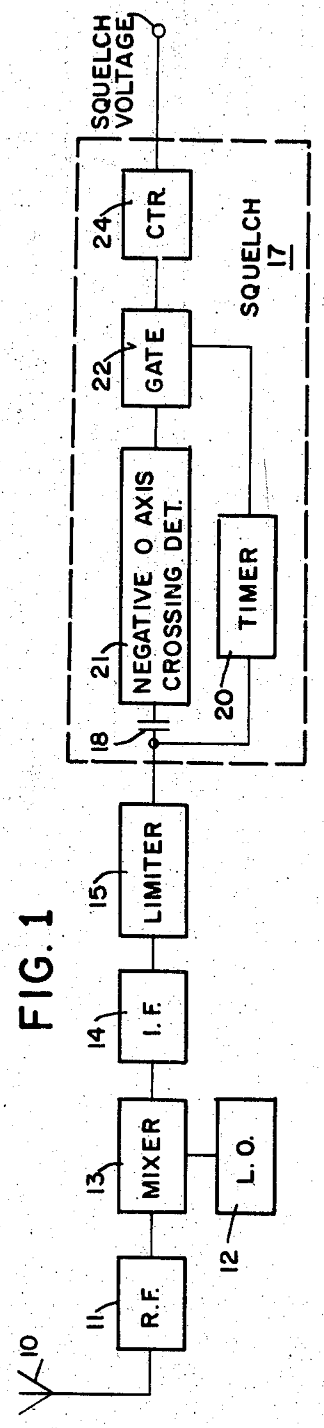

In many types of electrical systems it is desired to separate useful signals from interfering signals such as noise. This is of particular interest in a communications receiver which is in use intermittently so that for relatively long periods of time no useful signal is received. During the periods in which no useful signal is received the receiver gain is usually set at maximum and an objectionable noise signal can be heard. To eliminate the disturbing noise squelch circuits have been developed which distinguish between the useful signal and noise. The squelch circuits operate to turn off the audio portion of the receiver when noise signals only are present and turn on the audio portions of the receiver when the useful signal is received. However, most present squelch circuits use tuned LC circuits to distinguish between the noise and the useful signal. In present day sets it is desirable to integrate as much circuitry as possible and therefore it is desirable to provide squelch circuits which do not have LC circuits so that they can be easily integrated.

SUMMARY OF THE INVENTION

It is, therefore, an object of this invention to provide an improved squelch circuit.

Another object of this invention is to provide a squelch circuit which can be manufactured as an integrated circuit.

Another object of this invention is to provide a squelch circuit which does not have LC circuits.

In practicing this invention a squelch circuit is provided which detects zero axis crossings of the IF signal in a first direction and applies signals indicating such zero axis crossings to a counter through a gate. The IF signal is also applied to a time which is responsive to zero axis crossings in a second direction to develop a disabling signal which is applied to the gate. The disabling signal has a predetermined fixed time duration so that signals indicating a zero axis crossing in the first direction cannot be counted during the predetermined time period. By properly choosing the length of the predetermined time period the probability of a zero axis crossing in the first direction occurring during the time that the gate is enabled approaches zero for useful signals while the probability for noise is finite and large. Thus, when the desired signal becomes strong enough to be used, the counter output drops to a value approaching zero and acts to turn on the audio portion of the receiver.

Figure 2:
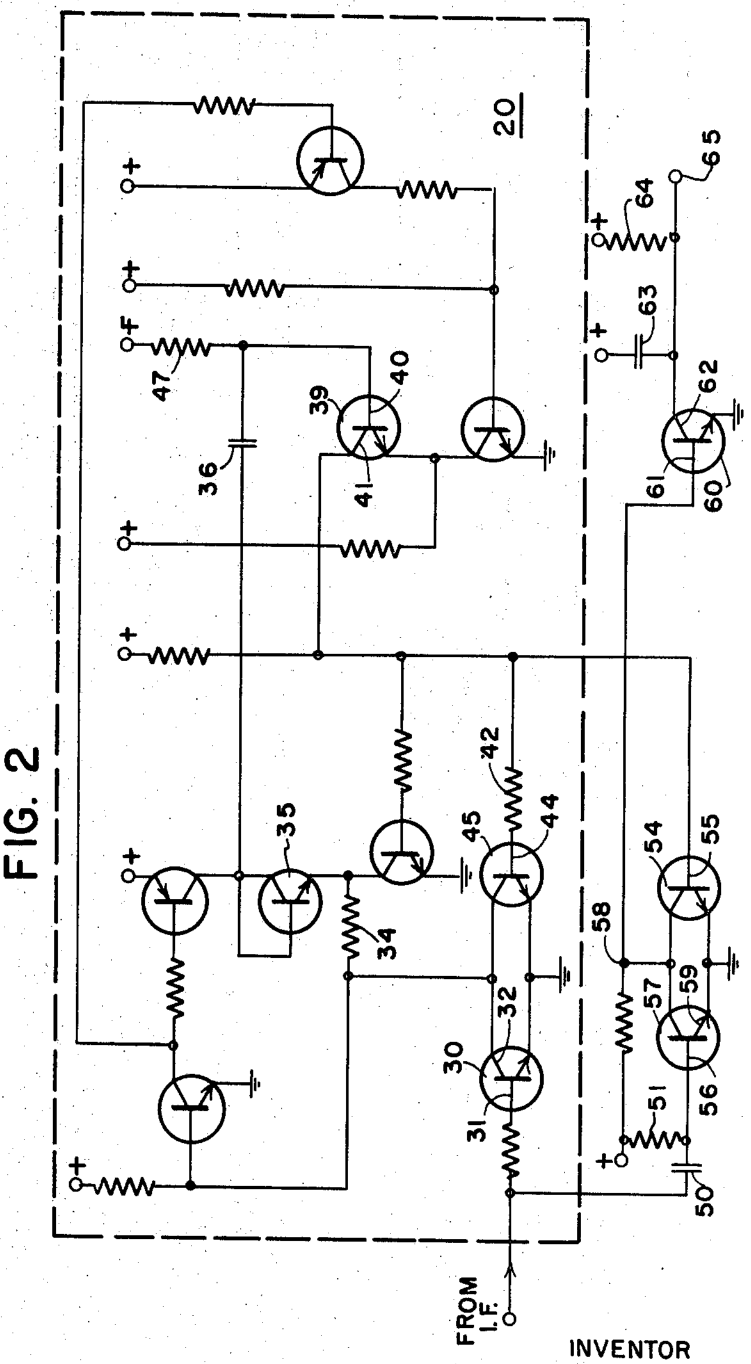

The invention is illustrated in the drawings of which:

FIG. 1 is a block diagram of the receiver incorporating the pulse counting squelch circuit of this invention; and FIG. 2 is a partial schematic and partial block diagram of the pulse counting squelch circuit of FIG. 1.

DETAILED DESCRIPTION OF THE INVENTION

Referring to FIG. 1 there is shown a block diagram of a receiver incorporating the features of this invention. An antenna 10 receives frequency modulated signals which are amplified in RF section 11 and mixed with signals from local oscillator 12 in mixer 13. The resulting IF signals are amplified by IF amplifier 14 and a limited IF signal is developed by limiter amplifier 15. The limited IF signal is coupled to squelch circuit 17.

The limited IF signal from limiter 15 is coupled to a negative zero axis crossing detector 21 through capacitor 18 and to timer 20. Timer 20 is responsive to positive zero axis crossings to develop an enabling signal for a fixed predetermined period of time. This signal is coupled to gate 22 to disable the gate for a fixed predetermined period of time.

When a negative zero axis crossing occurs the negative zero axis crossing detector 21 develops an output signal which is coupled to counter 24 through gate 22. Gate 22 can couple the negative zero axis crossing signals to counter 24 only during the period of time when a disabling pulse from timer 20 is not present. Counter 24 acts to sum the pulses applied thereto to develop an output signal in response to the number of signals counted.

The predetermined period of time during which timer 20 develops the disabling signal is selected to be slightly longer than one-half the period of the lowest frequency signal which is to be received. Thus when a desired signal is received, the disabling signal from timer 20 will be present when a negative zero axis crossing occurs so that counter 24 will not receive any signals indicating the zero axis crossing. Noise signals however have a random distribution of zero axis crossings and therefore there is a probability that negative zero axis crossings will occur during a period of time when the disabling signal from timer 20 is not present. These negative zero axis crossing pulses are counted by counter 24 to develop an output voltage which indicates that a noise signal is present.

In FIG. 2 there is shown a partial schematic and partial block diagram of a complete detector circuit. In the timer 20 the IF signal is applied to base 31 of transistor 30 to bias the transistor to conduction. With transistor 30 biased to conduction the potential on collector 32 drops and this drop in potential is coupled through resistor 34, diode 35 and capacitor 36 to base 40 of transistor 39. Transistor 39 is normally conducting and the negative spike applied to base 39 biases the transistor to non-conduction. With transistor 40 biased to non-conduction the potential on collector 41 rises and this rise in potential is coupled through resistor 42 to base 44 of transistor 45 to bias transistor 45 to conduction. This regenerative action maintains the potential on collector 32 of transistor 30 at a low level even after the IF signal drops to a low level cutting off transistor 30.

Transistor 45 is maintained in a conductive state until capacitor 36 charges through resistor 47 to a predetermined potential. When this predetermined potential is reached, transistor 45 is biased out of saturation and a regenerative switching action biases transistor 45 to non-conduction.

The increase in potential on collector 41 of transistor 39 is also coupled to base 55 of transistor 54 biasing transistor 54 to conduction. With transistor 54 biased to conduction the potential at point 58 drops and this drop in potential is coupled to base 61 of transistor 60 biasing transistor 60 to non-conduction. With transistor 60 biased to non-conduction the potential on collector 62 rises to a high value.

The IF signal is also coupled to base 56 of transistor 57 through capacitor 50. Capacitor 50, resistor 51 and the base 56, emitter 59, diode junction of transistor 57 acts as a negative zero axis crossing detector. Transistor 57 is normally biased to conduction by the positive potential supply through resistor 51. When the IF signal undergoes a zero axis crossing in the positive direction a momentary positive increase in the bias supply to transistor 57 occurs. However, since transistor 57 is already biased to saturation, there is no change in the conduction of transistor 57 and therefore no change in the potential developed at point 58. When a negative zero axis crossing occurs, the negative-going change in potential is coupled through capacitor 50 to develop a momentary negative impulse on base 56 of transistor 57, biasing transistor 57 to cutoff for a short period of time.

During the predetermined time period which ocurrs after a positive zero axis crossing, transistor 54 is biased to conduction and therefore any change in the conduction of transistor 57 does not affect the potential at point 58. After the predetermined time period, transistor 54 is biased to non-conduction and any negative zero axis crossing which occurs after this predetermined time acts to cutoff transistor 57 causing the potential at point 58 to rise. This rise in potential at point 58 is coupled to base 61 of transistor 60 to bias transistor 60 to conduction.

Capacitor 63 is normally discharged to a positive potential through resistor 64. This postive potential is applied to audio circuits from terminal 65 to bias the audio circuits to an operating state. As previously explained, when noise signals are not present the probability of the transistor 60 will be biased to conduction approaches zero and therefore there will be no change in the charge of capacitor 63. When noise is present the probability that transistor 60 will be biased to conduction is finite and large. Each time transistor 60 is biased to conduction the potential at capacitor 63 is reduced with the amount of reduction being a function of the number of negative zero axis crossings which occur outside of the predetermined time interval. Since noise will produce a large number of the negative zero axis crossings outside of the predetermined time interval, the potential on capacitor 63 will drop to a relatively low value. This change in potential on capacitor 63 is coupled from terminal 65 to the audio circuits to bias them to be inoperative.

What is claimed is:

1. A pulse counting squelch circuit for a frequency modulated signal which alternates between first and second levels with alternate zero axis crossings in a first direction and a second direction, including in combination, timer means adapted to receive the frequency modulated signal and being responsive to a zero axis crossing in the first direction to develop a timing signal of a predetermined time period, a zero axis crossing detector adapted to receive the frequency modulated signal and being responsive to a zero axis crossing in the second direction to develop an axis crossing signal, counter means for counting said axis crossing signals, gate means coupling said zero axis crossing detector to said counter means for applying said zero axis crossing signals thereto, said gate means being coupled to said timer means with said timing signals acting to disable said gate means whereby crossing signals are not coupled to said counter means during said predetermined time period.

2. The pulse counting squelch circuit of claim 1 wherein, said predetermined time period is longer than one-half the period of the lowest frequency of said frequency modulated signal.

3. The pulse counting squelch circuit of claim 2 wherein, said zero axis crossing detector includes differentiating means for differentiating the frequency modulated signal, a first transistor having an emitter electrode connected to a first reference potential, a base electrode coupled to said differentiating means and a collector electrode, said first transistor being of a polarity type to be biased to non-conduction by said zero axis crossing in said second direction.

4. The pulse counting squelch circuit of claim 3 wherein, said gate means includes a second transistor having a base electrode coupled to said timer means, an emitter electrode coupled to said first reference potential, and a collector electrode connected to said collector electrode of said first transistor and coupled to said counter means, and resistance means coupling said collector electrodes of said first and second transistors to a second reference potential.

5. The pulse counting squelch circuit of claim 4 wherein, said counter means includes a third transistor having a base electrode coupled to said collector electrode of said first and second transistors, an emitter electrode connected to said first reference potential and a collector electrode, and resistance means and capacitance means coupled in parallel between said second reference potential and said collector electrode of said third transistor.

6. A pulse counting squelch circuit, including in combination, radio circuit means for receiving a frequency modulated radio signal and developing therefrom a frequency modulated intermediate frequency signal, limiter means coupled to said radio circuit means for receiving said intermediate frequency signal and developing therefrom a limited intermediate frequency signal which alternates between first and second levels with alternate zero axis crossings in a first direction and a second direction, timer means coupled to said limiter means and responsive to a zero axis crossing in said first direction to develop a timing signal of a predetermined time period, a zero axis crossing detector coupled to said limiter means and responsive to a zero axis crossing in said second direction to develop an axis crossing signal, counter means for counting said axis crossing signals, gate means coupling said zero axis crossing detector to said counter means for applying said axis crossing signals thereto, said gate means being coupled to said timer means with said timing signals acting to disable said gate means whereby said crossing signals are not coupled to said counter means during said predetermined time period.

References Cited

UNITED STATES PATENTS

| | | | |
|---|---|---|---|
| 3,196,354 | 7/1965 | Engelbrecht | 325—348 |
| 3,300,723 | 1/1967 | Hansen | 325—348 |

RICHARD MURRAY, Primary Examiner

A. H. HANDAL, Assistant Examiner